United States Patent [19]

Moniwa et al.

[11] Patent Number: 4,808,546

[45] Date of Patent: Feb. 28, 1989

[54] SOI PROCESS FOR FORMING A THIN FILM TRANSISTOR USING SOLID PHASE EPITAXY

[75] Inventors: Masahiro Moniwa, Hachioji; Masanobu Miyao, Tokorozawa; Shoji Shukuri, Koganei; Eiichi Murakami, Kokubunji; Terunori Warabisako, Tokyo; Masao Tamura, Tokorozawa; Nobuyoshi Natsuaki, Higashiyamato; Kiyonori Ohyu, Hachioji; Tadashi Suzuki; Yuuichi Madokoro, both of Kokubunji; Yasuo Wada, Tokyo, all of Japan

[73] Assignee: Hitachi, Ltd., Tokyo, Japan

[21] Appl. No.: 9,476

[22] Filed: Feb. 2, 1987

[30] Foreign Application Priority Data

Jan. 31, 1986 [JP] Japan .................... 61-17922

[51] Int. Cl.$^4$ ............... H01L 21/265; H01L 21/26
[52] U.S. Cl. .................. 437/41; 148/DIG. 3; 148/DIG. 48; 148/DIG. 90; 148/DIG. 154; 156/603; 357/4; 357/41; 437/59; 437/62; 437/82; 437/89; 437/101; 437/174; 437/963; 437/973
[58] Field of Search ............. 29/571, 576 E, 576 T, 29/578, 580, 576 B; 148/1.5, 174, 187, DIG. 3, 20, 29, 40, 76, 82, 83, 105, 106, 154, DIG. 48, 90; 156/603; 357/34, 23.7, 60; 437/89, 59, 62, 82, 101, 174, 963, 973

[56] References Cited

U.S. PATENT DOCUMENTS

| | | | |
|---|---|---|---|
| 4,113,533 | 9/1978 | Okumura et al. | 148/187 |
| 4,468,855 | 9/1984 | Sasaki | 29/576 B |
| 4,487,639 | 12/1984 | Lam et al. | 148/175 |
| 4,494,300 | 1/1985 | Schwuttke et al. | 29/571 |
| 4,498,951 | 2/1985 | Tamura et al. | 156/612 |
| 4,499,657 | 2/1985 | Ooga et al. | 29/578 |
| 4,557,036 | 12/1985 | Kyuragi et al. | 29/571 |
| 4,609,407 | 9/1986 | Masao et al. | 437/89 |
| 4,628,588 | 12/1986 | McDavid | 29/571 |
| 4,643,777 | 2/1987 | Maeda | 148/1.5 |
| 4,654,958 | 4/1987 | Baerg et al. | 29/571 |

FOREIGN PATENT DOCUMENTS

| | | | |
|---|---|---|---|
| 0110169 | 6/1984 | Japan | 29/571 |
| 0245211 | 12/1985 | Japan | 148/DIG. 154 |

OTHER PUBLICATIONS

Douglas, "The Route to 3-D Chips," High Technology Sep. 1983 pp. 55-59.
"Yamamoto et al.,". . . Lateral Solid Phase Epitaxial Growth . . . Si films by . . . Implanation", Appl. Phys. Lett., 46(3), Feb. 1, 1985.
Brown et al., "Self-Registered Molybdenum-Gate pp. 268-270".
MOSFET, "J. Electrochem. Soc.", vol 115 No. 8, Aug. 1968 pp. 874-876.

Primary Examiner—Brian E. Hearn
Assistant Examiner—William Bunch
Attorney, Agent, or Firm—Antonelli, Terry & Wands

[57] ABSTRACT

Of an amorphous Si film, a region to be formed into a lowly doped region such as the channel region of an MOS transistor is covered with a mask and an uncovered region is doped with an impurity. After this, the amorphous Si film is annealed and turned to signal crystal through solid phase epitaxial growth, and the mask itself is used as the electrode of a semiconductor device. By this impurity doping, a large-sized single-crystal Si film can be formed, and the impurity doping can be conducted in self-alignment with the electrode formation to produce a highly integrated semiconductor circuit.

24 Claims, 5 Drawing Sheets

SOI PROCESS FOR FORMING A THIN FILM TRANSISTOR USING SOLID PHASE EPITAXY

BACKGROUND OF THE INVENTION

The present invention relates to a process of fabricating semiconductor devices and, more particularly, to a process of forming a crystalline semiconductor on an insulating film through solid-phase crystalline growth to form a semiconductor device on that crystalline semiconductor.

In order to realize an LSI capable of superhigh speed operations and having a large scale integration, it has been proposed to fabricate an SOI structure by various processes. The "SOI" is the abbreviation of "Silicon On Insulator" and implies formation of a high-quality crystalline (e.g., single-crystal or large-grain polycrystalline) Si film. Of SOI fabricating techniques, the technique making use of the solid-phase epitaxial growth is accepted as one of the most promising techniques as a process best fit for lamination and high integration because it can form single-crystal film at a low temperature. In order to form a single-crystal film having a sufficient area, however, this process in required to add an electrically active impurity to an amorphous Si film up to its solid solubility limit, as has been discussed on pp. 268 to 270, Vol. 46 (1985), Applied Physics Letters. This raises a problem that a variety of semi-conductor elements having many regions doped with impurities in various concentrations cannot be formed in a single-crystal film containing such much impurities.

The most typical one of the SOI techniques utilizing the solid-phase epitaxial growth comprises, as schematically shown in FIG. 10, the steps of: forming a $SiO_2$ film 2 on a single-crystal Si substrate 1; depositing an amorphous Si film 3 thereon by the electron beam evaporation or the like; and subsequently heating the amorphous Si film 3 to about 600° C. to crystallize it (for the solid-phase epitaxial growth) in the directions indicated by arrows 5. Since the $SiO_2$ film 2 is formed at places with apertures 7, the amorphous Si film 3 makes contact with the single-crystal Si substrate 1 through those apertures 7. When heated, the contacting portions of the single-crystal substrate 1 act as seed crystals from which the crystallizations start. The crystal growths proceed before long onto the $SiO_2$ film 2 so that SOI regions 6 having the same crystal orientation as that of the substrate 1 are formed. After some heating time period (e.g., about 10 hours), on the other hand, the amorphous Si film 3 polycrystallize at places apart from the seed crystal regions 7 independently of the above-specified crystal growths. Since the polycrystalline Si film 8 thus formed blocks the aforementioned crystal growths, as shown in FIG. 11, the areas of the SOI regions 6 finally obtained are determined depending upon the balance between the rate of the aforementioned crystal growths and the time period required for that polycrystallization. In case an amorphous Si film containing no impurity is used, the crystal growth rate is about $1.0 \times 10^{-8}$ cm/s, whereas the time period required for forming the polycrystalline Si film 8 is about 10 hours. The SOI regions 6 obtained are located within a range of about 4 microns from the ends of the seed crystal regions 7. This behavior is shown in FIG. 13. This extension is not sufficient for fabricating the semiconductor devices. A proposal made to solve this problem is the aforementioned impurity doping method. This method uses an amorphous Si film to which an electrically active impurity such as P, B or As is added up to its solid solubility limit. Then, as shown in FIG. 13, the crystal growth rate is increased to enlarge the SOI regions 6. In case P is added, for example, SOI regions of about 24 microns are obtained by about 10 hours later when the polycrystalline Si film begins to be formed. According to this method, however, the amorphous Si film has too high an impurity concentration to form the device in it although the extension raises no problem. At present, therefore, it has been tried, as shown in FIG. 12, to form the SOI regions, to subsequently deposit the single-crystal Si film having a low impurity concentration all over the surfaces on the SO regions by molecular beam epitaxial (i.e., MBE) growth, and to form an MS transistor therein. With this construction, however, a film 9 where the device is formed is underlaid with an SOI film 4 and the polycrystalline Si films 8 to result in the losses of the major merits of the SOI structure: (1) the merit that the element operations are speeded up; and (2) the merit that the element separation is facilitated to enable the high integration, both of which could have been obtained in the presence of the underlying insulating film.

SUMMARY OF THE INVENTION

An object of othe present invention is to provide a fabricating process for semiconductor devices which can solve the above-specified problems of the prior art and form sufficiently wide SO regions through solid-phase epitaxial growth without losing the aforementioned advantages of the SOI structure.

In order to achieve the above-specified object, according to the present invention, such regions of an amorphous Si film as are to be formed into the lowly doped regions (e.g., the channel regions of an MOS transistor or the base of a bipolar transistor) of various semiconductor devices are covered with a mask and doped with an impurity and are then subjected to solid phase growth to form an amorphous Si film, and this amorphous Si film is single-crystallized. And, the aforementioned mask is used as the electrode of the aforementioed semi-conductor device.

DETAILED DESCRIPTION OF THE PREFERRED EMBODIMENTS

As has been described hereinbefore, according to the present invention, such portions of the amorphous Si film as are to be used as lowly doped regions of various semiconductor devices such as transistors are covered with a mask and doped with an impurity. After this, the doped portions are heated and single-crystallized through the solid phase epitaxial growth. Since the amorphous Si film is doped with the impurity, it is possible to form a single-crystal Si film having a sufficient area. Since, moreover, the portions to be used as the lowly doped regions of a transistor or the like are not doped with any impurity during the doping after providing the mask, the various semiconductor devices including the transistor can be fabricated easily without any trouble.

Since the aforementioned mask is used as the electrode of the semiconductor device, still moreover, the aforementioed impurity doping is conducted in self-alignment with the electrode so that a fine semiconductor device having a small area required is fabricated.

EXAMPLE 1

Figure 1:
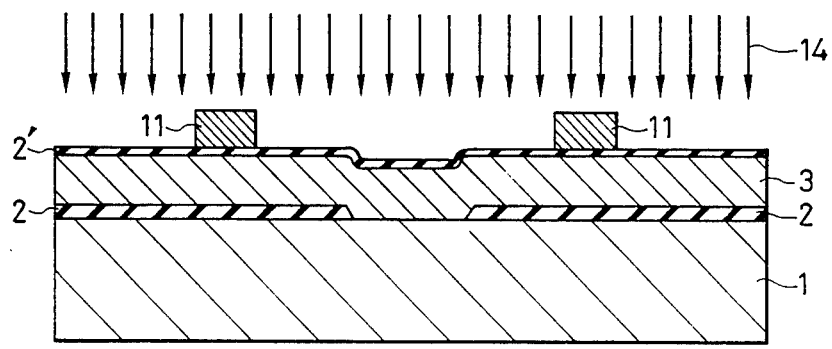
FIG. 1 is a section for explaining the construction of the present invention.
Figure 2:
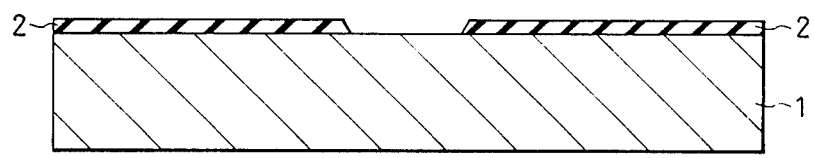
FIGS. 2 to 5 are sections showing the steps of one embodiment of the present invention.
Figure 3:
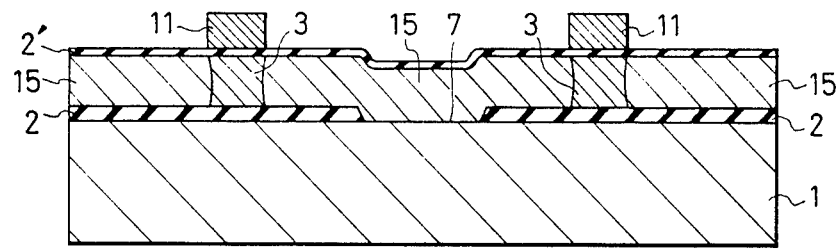
Figure 4:
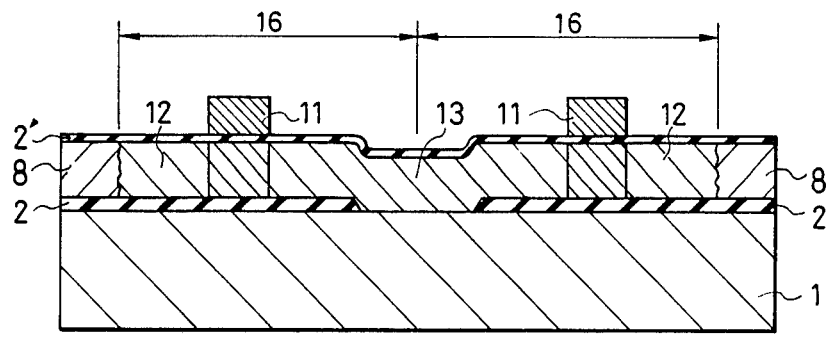
Figure 5:
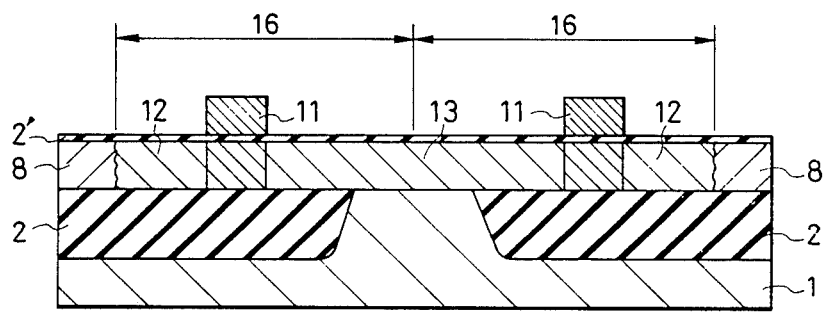

In this example, an MOS field effect transistor was formed in the SOI region. As shown in FIG. 2, a single-crystal Si substrate 1 having an electric conductivity of p type, a resistivity of 10 ohm-cm and a plane orientation (100) was formed thereon with a thermally oxidized film 2 having a thickness of 500 Å, which was formed at its desired portions with apertures by the use of the ordinary photolithography. This intermediate structure was introduced into a ultrahigh vacuum (up to $10^{-10}$ Torrs) to deposit thereon an amorphous Si film 3 having a thickness of 2,000 Å by electron beam evaporation, as shown in FIG. 3. Next, the amorphous Si film 3 was formed all over its surface with a SiO$_2$ film 2' having a thickness of 250 Å by the use of oxygen plasma excited by the electron cyclotron resonance. The temperature of the Si substrate 1 at this time was set at 550° C. Polycrystalline Si films 11 containing P up to about $10^{20}$ cm$^{-3}$ were formed by the ordinary LSI process, and unnecessary portions were removed therefrom. These polycrystalline Si films 11 finally provided the gate electrodes of MOS transistors and had a width (or gate length) of 0.8 microns. After this, as shown in FIG. 1, P+ ions 14 were implanted into the amorphous Si films 3 by using the polycrystalline Si films 11 as a mask. The ion implantations were triple with the respective implantation energies and dosages: (40 keV, $1.05 \times 10^{15}$ cm$^{-2}$); (80 keV, $1.95 \times 10^{15}$); and (150 keV, $5.70 \times 10^{15}$ cm$^{-2}$). At the end of these ion implantations, the impurity concentration in the amorphous Si was constant at $3 \times 10^{20}$ cm$^{-3}$ in the depth direction. The section after the implantations is shown in FIG. 3. Denoted by reference numeral 15 in FIG. 3 are regions which were doped with the P+ions. These P+ions were implanted not into the portions 3 covered with the polycrystalline Si films 11 but into the portions 15 which were not covered. After an annealing treatment at 600 ° C. in dried N$_2$ gas using an electric furnace, solid phase epitaxial growth occurred. After 10 hours, the amorphous Si films turned into single-crystal films having the same crystal orientation as that of the substrate 1 to a length of about 19 microns from seed crystal regions 7. While the regions 3 containing relatively little impurity were crystally growing, their growth rate was slow so that the final crystal growth length was rather shorter than that of single-crystal film doped with an impurity all over its surface. Since the polycrystalline Si films 11 had the aforementioed width as small as 0.8 microns, however, the time period required for their crystal growth was so short that they exerted very little influence upon the crystal growth length. The experiments under selected different annealing conditions have revealed that the single crystal could be made at a temperature range of 400° C. to 800° C. for a time range of 5 hours to 50 hours, and that the best preferable atmosphere was inert gases such as nitrogen and helium gases or hydrogen gas. Since the impurity atoms were electrically activated simultaneously with the crystal growth, as shown in FIG. 4, regions 12 and 13 doped with the impurity provided the drain and source regions, respectively, so that MOS field effect transistors 16 were completed at the end of the crystallization. In the present example, the impurity used was P but may be another electrically active impurity such as As or B. The best impurity concentration at this time is at about the limit of solid solubility but may be reduced up to one fifth. Although no impurity was added to the operating regions (i.e., channel regions) of the MS transistors during impurity doping using mask, it is sufficient to add an impurity other than that which was used to from the source and drain regions. At the step of depositing the amorphous Si, more specifically, the impurity is added to the whole region of the film by using the method of ionizing doping, or the doping with the impurity is conducted by inserting the ion implanting step before forming the aforementioned polycrystalline Si film (i.e., gate electrode). In case an LSI composed of fine elements is to be fabricated, on the other hand, it is important for the substrate to have a flat surface. As shown in FIG. 5, therefore, it is advisable to bury the SiO$_2$ film 2 in the Si substrate 1.

EXAMPLE 2

Figure 6:
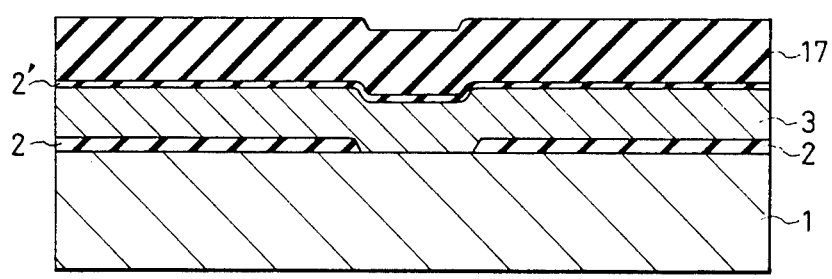
FIGS. 6 to 9 are sections showing the steps of another embodiment of the present invention.
Figure 7:
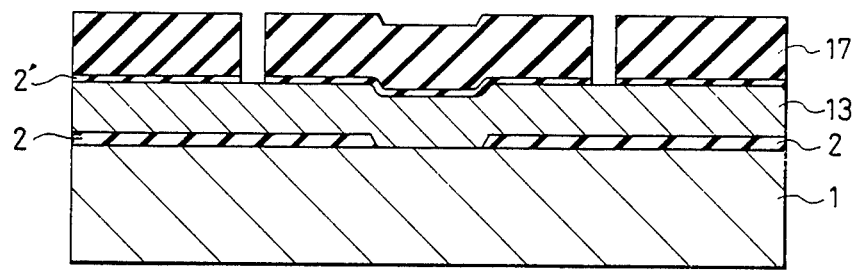
Figure 8:
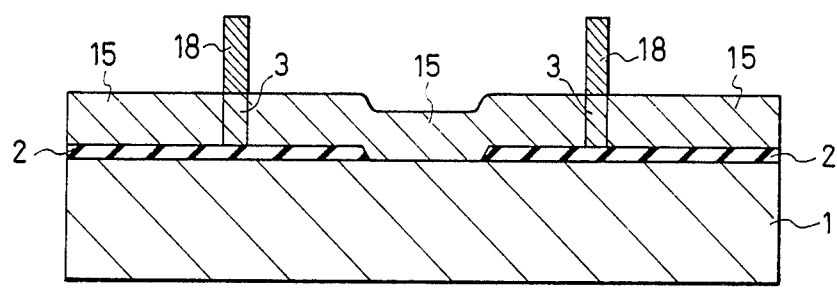
Figure 9:
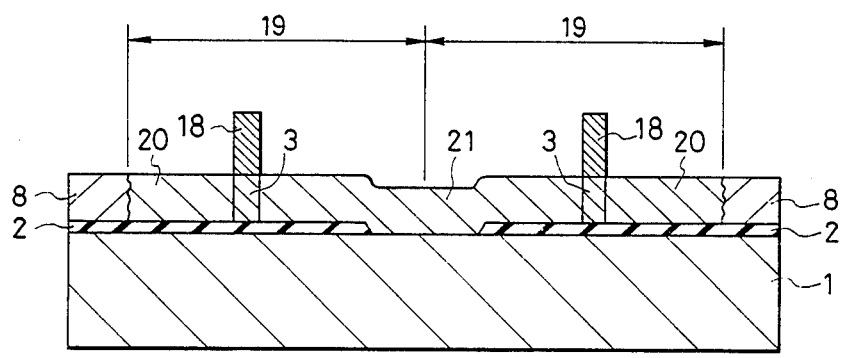
Figure 10:
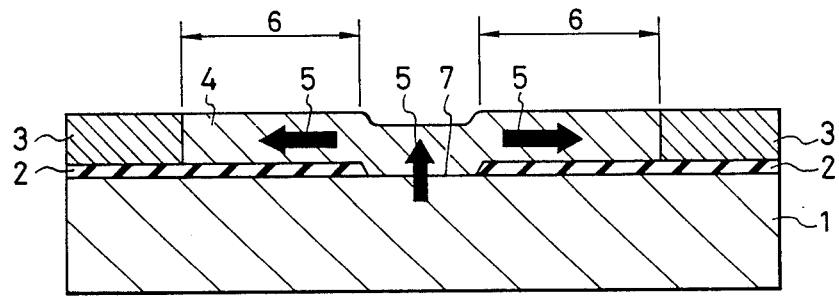
FIGS. 10 and 11 are sections for explaining the conventional process for forming a single-crystal semiconductor film through the solid phase growth.
Figure 11:
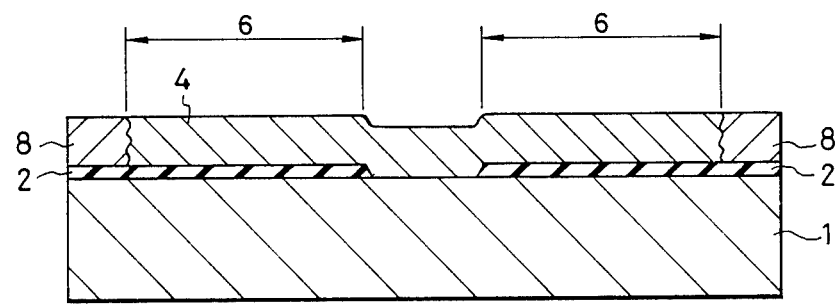
Figure 12:
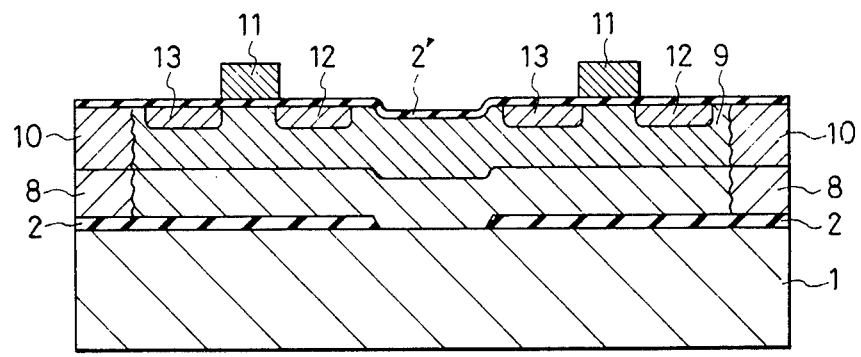
FIG. 12 is a section showing one example of an MOS transistor which is fabricated by using a single-crystal semiconductor film formed through the solid phase growth according to the prior art.
Figure 13:
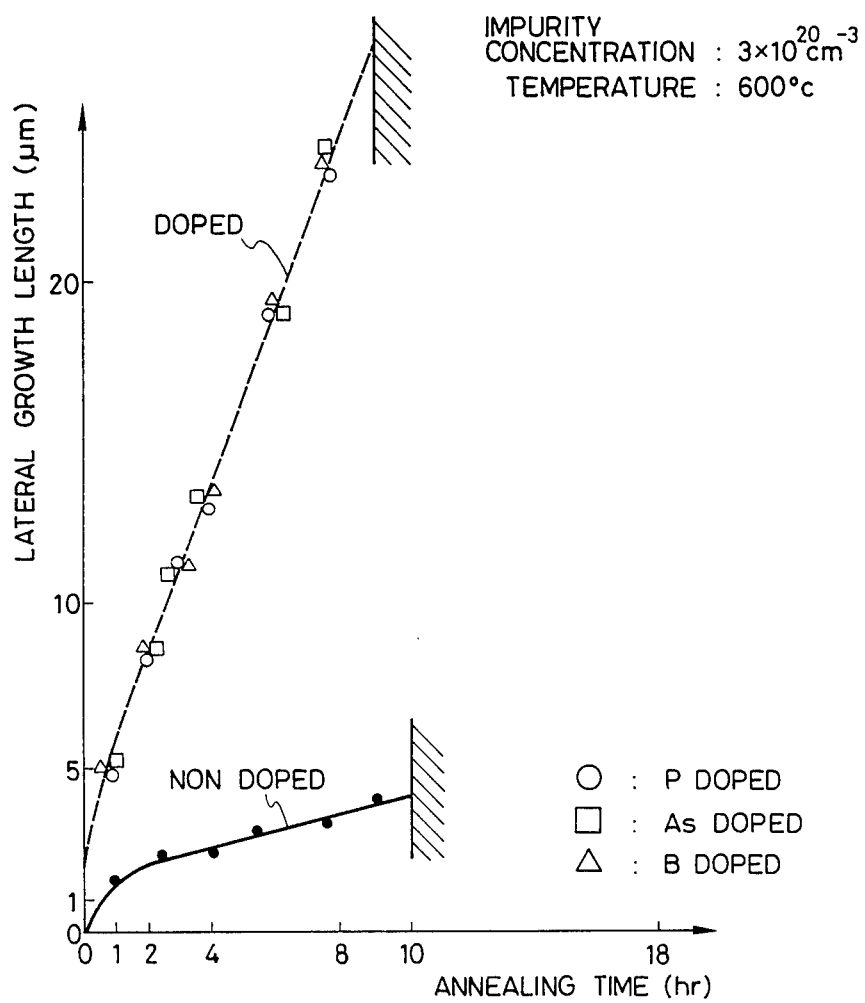
FIG. 13 is a graph plotting the relation between the annealing time and the lateral growth length in case an amorphous Si film doped with an impurity and a non-doped amorphous film are heated at 600° C.

In this example, a lateral bipolar transistor is fabricated in the SOI. According to procedures similar to those of the example 1, as shown in FIG. 6, an amorphous Si film 3 was deposited on the single-crystal Si substrate 1 having the SiO$_2$ film 2, and the SiO$_2$ film 2' having a thickness of 250 Å was formed thereon. After this, the SiO$_2$ was deposited by the use of the plasma CVD to form a SiO$_2$ film 17 having a thickness of 5,000 Å. Then, by jointly using the electron beam drawing technique and the anisotropic etching using microwaves, as shown in FIG. 7, contact holes were locally formed in the SiO$_2$ film 17. In this state, B+ions were implanted (i.e., three times with energies of 25 keV, 40 keV and 53 keV) into the amorphous silicon film 3 through the aforementioed contact holes. These ion implantations were the dopings for forming the base region of the bipolar transistor. Next, polycrystalline Si of high impurity concentration was deposited to fill the contact holes in polycrystalline Si 18, and the polycrystalline Si deposited on the SiO$_2$ film 17 was removed by the well-known bias sputtering method. The polycrystalline Si 18 filling the contact holes finally provided the lead-out electrode of the base. After this, by a selective etching, the SiO$_2$ films 2' and 17 were removed to provide a structure shown in FIG. 8. In this state, P+ions were implanted under the same conditions as those of the example 1 to form the implanted region 15. After this, by annealing at 600 ° C., lateral bipolar transistors 19 were completed, as shown in FIG. 9. In FIG. 9, of the single-crystal Si film, regions 20 and 21 doped with the B+ions provide the emitter and collector, respectively, and the non-doped regions 3 provide base regions. Incidentally, the remaining polycrystalline Si films 18 provide the base electrodes, and reference numeral 8 denotes the polycrystalline Si regions which were formed upon the solid-phase epitaxial growth. The regions 3 acting as the bases are also so narrow in the present example that the single-crystalline Si films having large areas can be formed to provide the bipolar transistors without deteriorating the advantages of the SOI.

In the bipolar transistors, too, like the case of the MOS field effect transistors, the impurity may be any if it is an electrically active element and may be implanted all over the amorphous Si film when the amorphous Si film is formed or before the base electrode is formed. Like discussion applies to the realizable annealing conditions, and the conditions exemplified in the example 1 can be used as they are. In either of the examples 1 and 2, moreover, the present invention is apparently effective even if the substrate has its whole surface covered with the SiO$_2$ film. In this case, however, there may possibly arise a problem that crystal particles steal into the operating regions of the device in which the crystal orientation of the single-crystal Si film cannot be controlled. Thus, the insulating film 2 having the apertures may preferably be used, as in the foregoing examples, so that the amorphous Si film may partially make direct contact with the surface of the single-crystal Si substrate 1 at the aforementioned apertures.

As is now apparent from the description thus far made, according to the present invention, the large-sized singlecrystal Si film can be formed on the insulating film through the solid phase epitaxial growth to make the SOI structure. In addition, a large quantity of impurity having doped the amorphous Si film so as to promote the solid phase growth raises no obstruction against formations of various semiconductor devices. Since the mask having been used for selective doping of the impurity can be used as the electrode of a semiconductor device, the impurity doping and the electrode formation can be accomplished in self-alignment so that fine devices can be formed in the single-crystal Si film. Thus, a highly integrated semiconductor device can be fabricated without deteriorating the advantages owned by the SOI structure.

What is claimed is:

1. A process for fabricating a semiconductor device, comprising:
   the step of forming an insulating film having apertures on the principal surface of a single-crystal semiconductor substrate;
   the step of forming an amorphous semiconductor film extending from the exposed surface of said semiconductor substrate onto said insulating film;
   the step of forming a mask on such regions of said amorphous semiconductor film as will have a low impurity concentration, said mask constituting an electrode of said semiconductor device;
   the step of doping those regions of said amorphous semiconductor film, which are not covered with said mask, with an impurity, the regions that are doped forming impurity-doped regions of the semiconductor device; and
   the step of annealing said amorphous semiconductor film to form the doped portions of said amorphous semiconductor film into single-crystal semiconductor films through the solid-phase epitaxial growth while electrically activating the impurity atoms, so as to simultaneously provide the single-crystal semiconductor films and the impurity-doped regions of the semiconductor device.

2. A semiconductor device fabricating process according to claim 1, wherein said single-crystal semiconductor substrate and said amorphous semiconductor film are a single-crystal Si substrate and an amorphous Si film respectively.

3. A semiconductor device fabricating process according to claim 1, wherein said annealing step is conducted at a temperature ranging from 400° C. to 800° C.

4. A semiconductor device fabricating process according to claim 1, wherein said impurity is selected from a group consisting of phosphorus, arsenic and boron.

5. A semiconductor device fabricating process according to claim 1, wherein said impurity is implanted substantially up to its solid solubility limit.

6. A semiconductor device fabricating process according to claim 1, wherein the regions of said single-crystal semiconductor film covered with said mask provide the channel regions of an MOS transistor.

7. A semiconductor device fabricating process according to claim 1, wherein the regions of said single-crystal semiconductor film doped with said impurity provide the source and drain regions of an MOS transistor.

8. A semiconductor device fabricating process according to claim 1, the region of said single-crystal semiconductor film covered with said mask provides the base of a bipolar transistor.

9. A semiconductor device fabricating process according to claim 1, wherein the regions doped with said impurity provide the emitter and collector of a bipolar transistor.

10. A semiconductor device fabricating process according to claim 1, wherein said electrode is the gate electrode of an MOS transistor.

11. A semiconductor device fabricating process according to claim 1, wherein said electrode is the base electrode of a bipolar transistor.

12. A semiconductor device fabricating process according to claim 1, wherein said amorphous semiconductor film is formed extending from directly in contact with the exposed surface of said semiconductor surface onto said insulating film.

13. A semiconductor device fabricating process according to claim 1, wherein the semiconductor device is formed in an active region of the single-crystal semiconductor films, and wherein the doping and annealing are performed so as to promote the growth of the single-crystal semiconductor films through solid-phase epitaxial growth and to provide doped portions which constitute part of the semiconductor device.

14. A semiconductor device fabricating process according to claim 13, wherein said doping is performed so as to introduce the impurity in self-alignment with said mask, whereby, in said semiconductor device, the impurity-doped regions of the semiconductor device are in self-alignment with said electrode.

15. A semiconductor device fabricating process according to claim 1, wherein said insulating film is formed so as to be coplanar with the exposed surface of the semiconductor substrate.

16. A semiconductor device fabricating process according to claim 1, wherein a single amorphous semiconductor film is formed between said insulating film and said mask.

17. A semiconductor device fabricating process according to claim 16, wherein said single amorphous semiconductor film is formed extending from directly in contact with the exposed surface of said semiconductor surface onto said insulating film.

18. A semiconductor device fabricating process according to claim 1, wherein the step of annealing causes the regions of the amorphous semiconductor film covered with said mask to be single-crystallized so as to form the regions of the amorphous semiconductor film covered with said mask into single-crystal semiconductor films.

19. A semiconductor device fabricating process according to claim 1, wherein the mask is provided over the insulating film, and regions of the amorphous semiconductor film having a low impurity concentration are formed in direct contact with the insulating film.

20. A semiconductor device fabricating process according to claim 13, wherein the mask is provided over the insulating film, and regions of the amorphous semiconductor film having a low impurity concentration are formed in direct contact with the insulating film.

21. A semiconductor device fabricating process according to claim 1, wherein said amorphous semiconductor film is a single semiconductor film.

22. A semiconductor device fabricating process according to claim 21, wherein, after the step of doping and annealing, the single semiconductor film has first portions, that extend between opposed surfaces thereof furthest from and closest to the substrate, that have a low impurity concentration; and second portions, that extend between said opposed surfaces, different from said first portions, that have a high impurity concentration.

23. A semiconductor device fabricating process according to claim 22, wherein said single semiconductor film is formed in direct contact with the exposed surface of the semiconductor substrate.

24. A semiconductor device fabricating method according to claim 1, wherein said mask is formed on regions of the amorphous semiconductor film that will have a low impurity concentration in said semiconductor device.

* * * * *